United States Patent [19]

Ohmi

[11] Patent Number: 5,528,068
[45] Date of Patent: Jun. 18, 1996

[54] SEMICONDUCTOR DEVICE

[76] Inventor: Tadahiro Ohmi, 1-17-301, Komegabukuro 2-chome, Aoba-ku Miyagi-ken Sendai-shi, Japan

[21] Appl. No.: 335,871

[22] PCT Filed: May 12, 1993

[86] PCT No.: PCT/JP93/00621

§ 371 Date: Nov. 10, 1994

§ 102(e) Date: Nov. 10, 1994

[87] PCT Pub. No.: WO93/23878

PCT Pub. Date: Nov. 25, 1993

[30] Foreign Application Priority Data

May 13, 1992 [JP] Japan ................... 4-146330

[51] Int. Cl.$^6$ ................................. H01L 29/76
[52] U.S. Cl. .................. 257/410; 257/310; 257/392; 257/411
[58] Field of Search ................. 257/310, 392, 257/410, 411

[56] References Cited

U.S. PATENT DOCUMENTS 3,676,756  7/1972  Merrin ................... 257/410
5,365,094  11/1994  Takasu ................... 257/410

FOREIGN PATENT DOCUMENTS 1-266764  10/1989  Japan.
3-74878  3/1991  Japan.
3-69166  3/1991  Japan.

*Primary Examiner*—Edward Wojciechowicz
*Attorney, Agent, or Firm*—Baker & Daniels

[57] ABSTRACT

It is an object of the present invention to provide a semiconductor device having a high current driving capability and capable of high-speed circuit operation. This device has a first semiconductor region of one conductivity type on a substrate; source and drain regions of the opposite conductivity type in the first region; a first insulating film on the substrate between the source and drain regions; and a conductive gate electrode on the first insulating film. The first insulating film comprises an insulator having a dielectric constant of 8 or more and its film thickness $t_f$ satisfies the following express (1). The source and drain regions are formed in a self-alignment manner with respect to the gate electrode: $t_f < 3 \times (\epsilon_r/\epsilon_{SiO2})$ (nm) (1) where $\epsilon_r$ is the dielectric constant of the first insulating film, and $\epsilon_{SiO2}$ is the dielectric constant of the silicon oxide film.

7 Claims, 8 Drawing Sheets

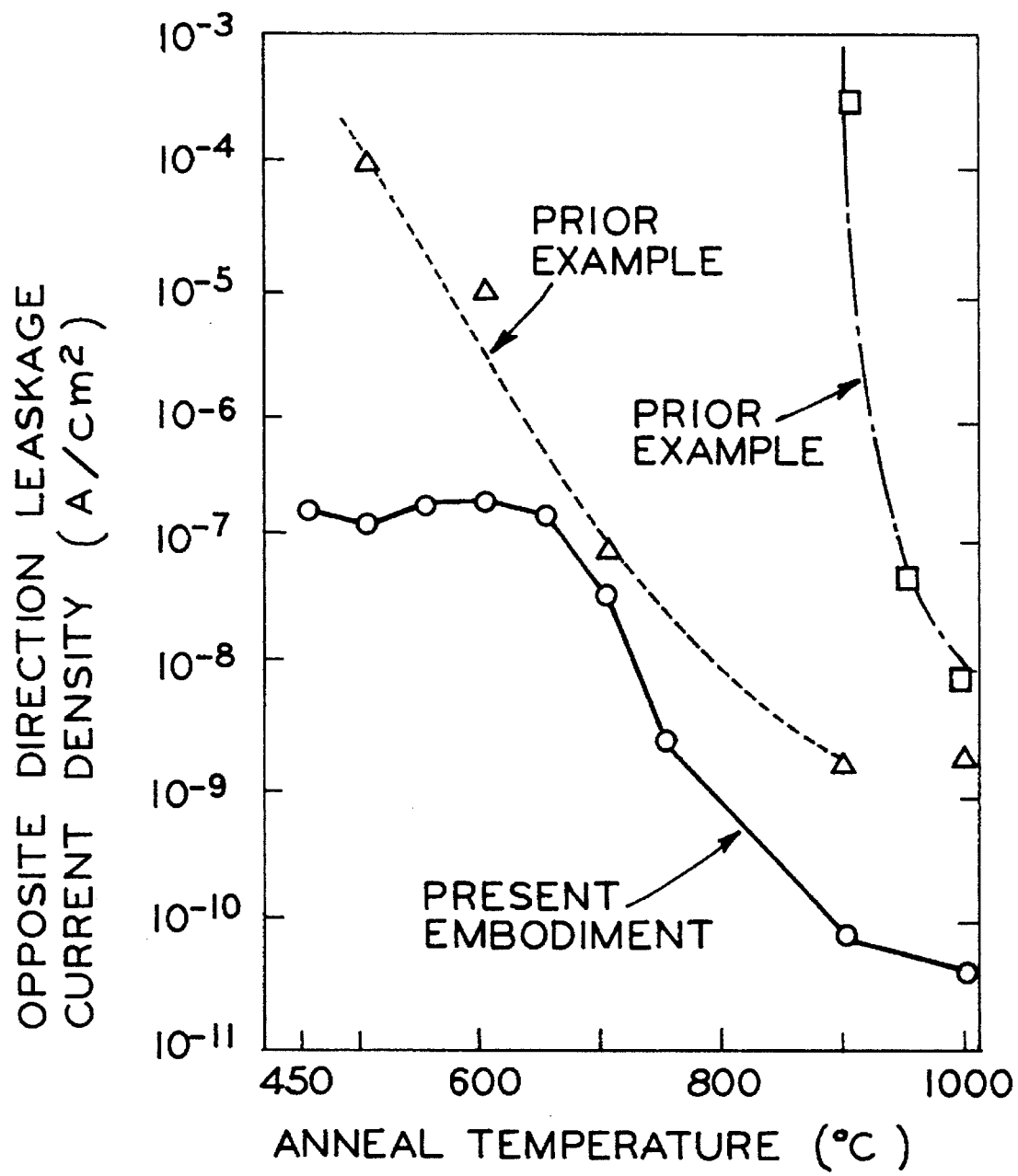
FIG_3

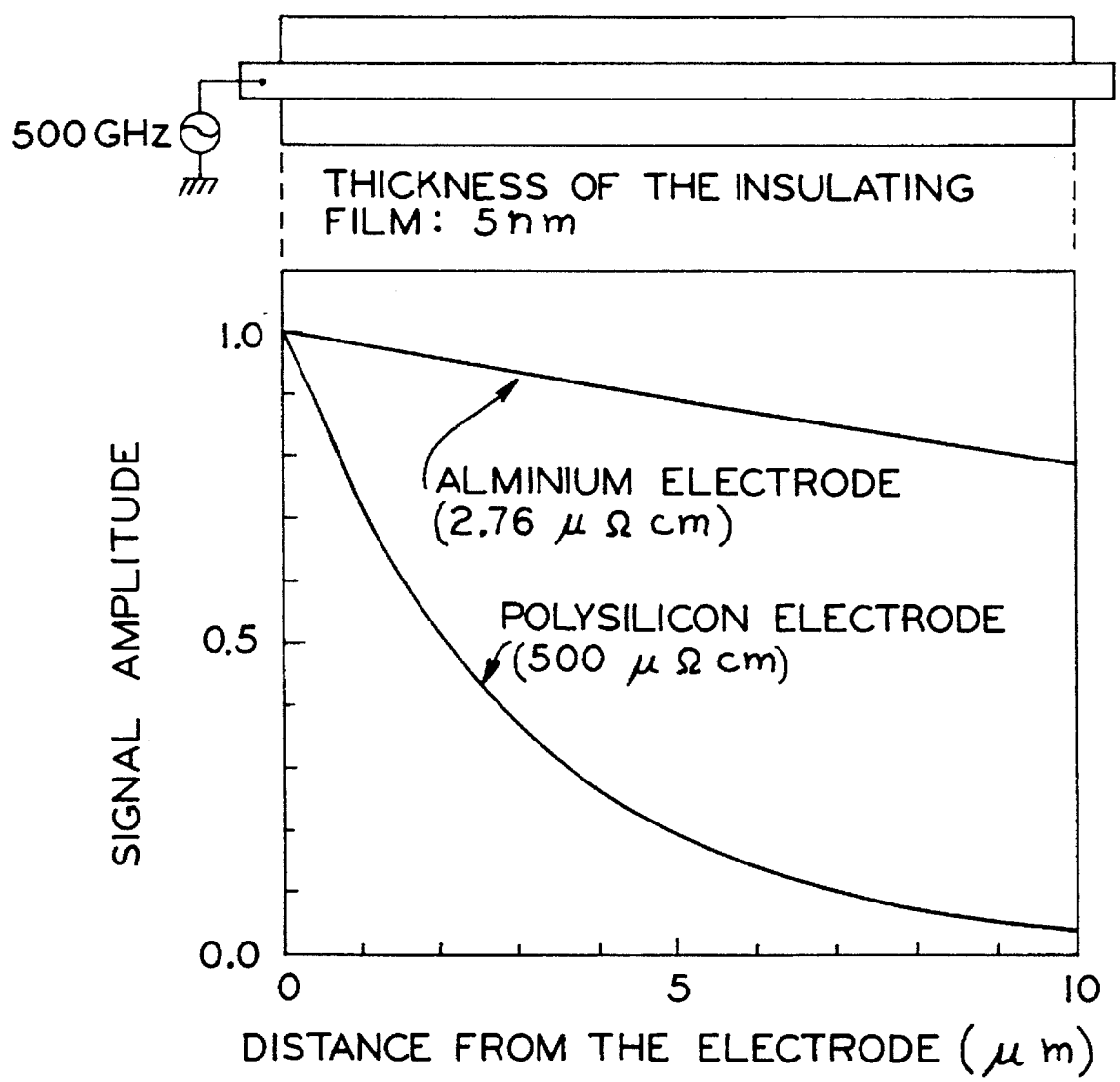
FIG_4

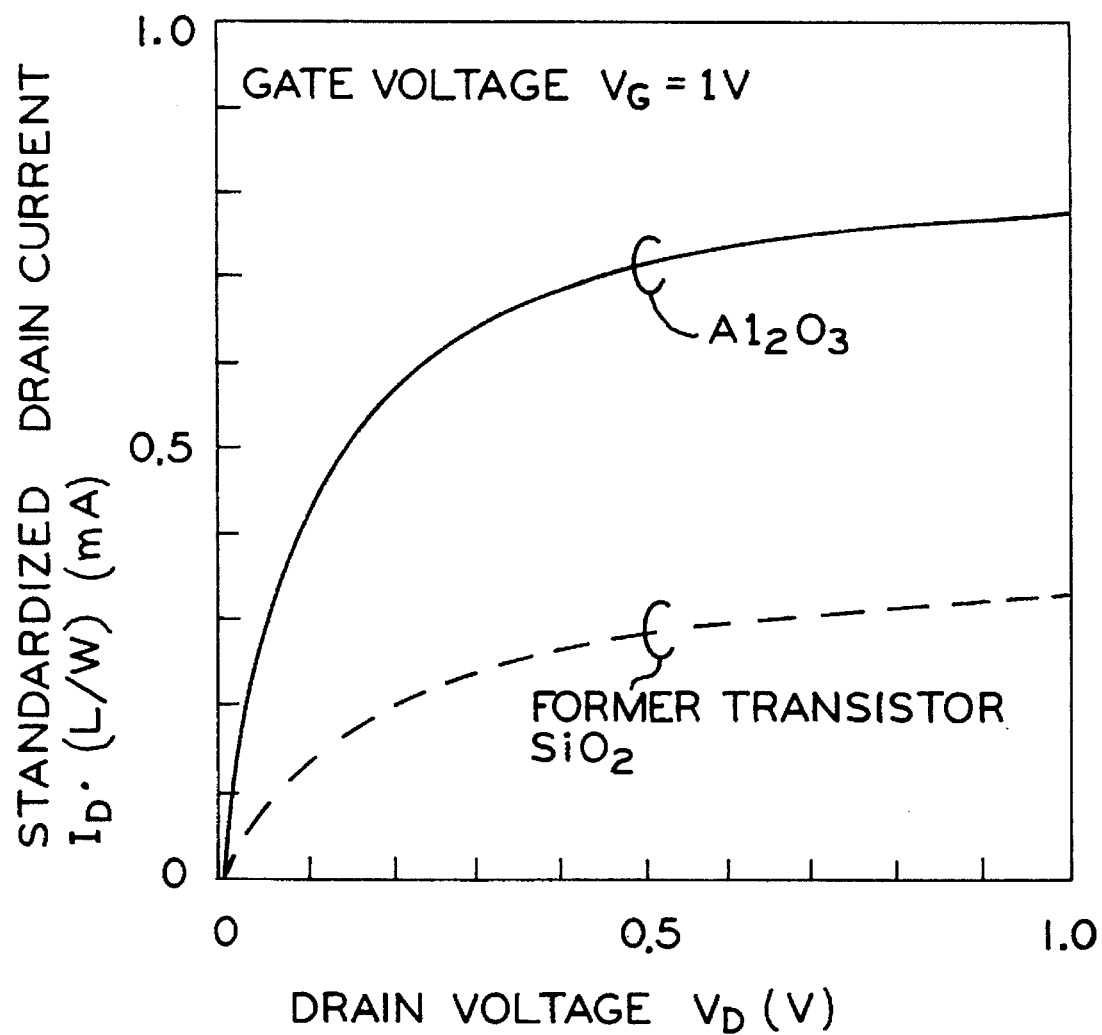
FIG_5

FIG_6A
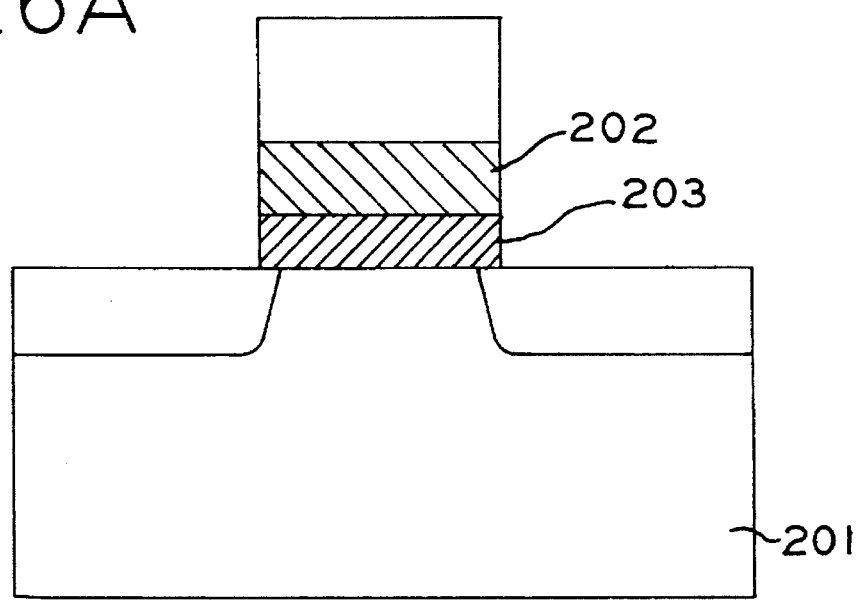
FIG_6B
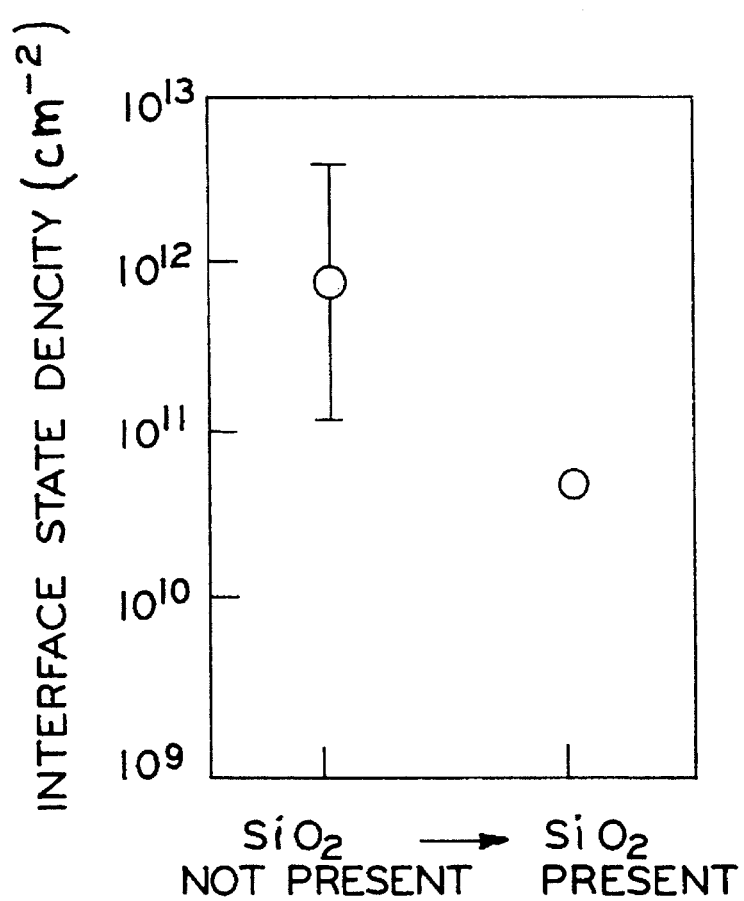

FIG_7A
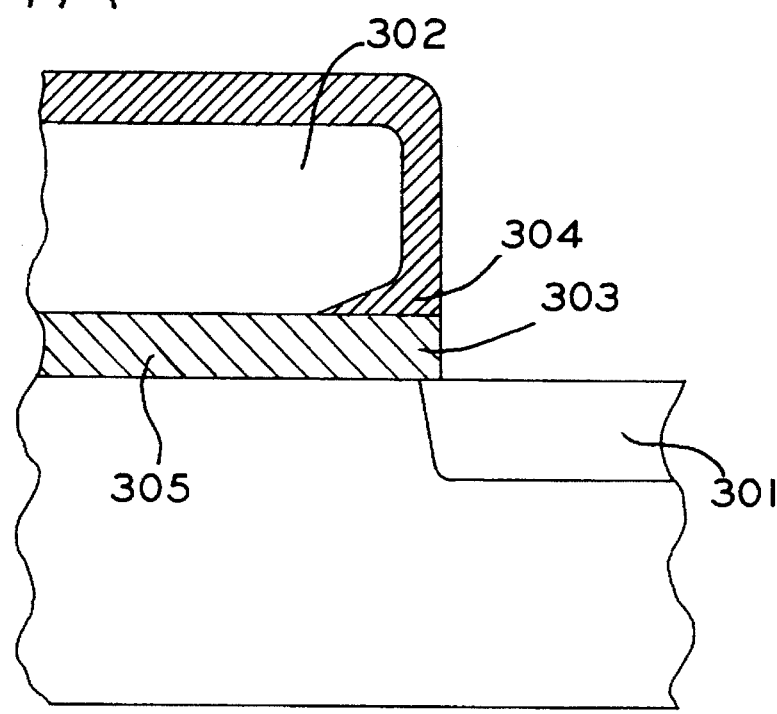
FIG_7B
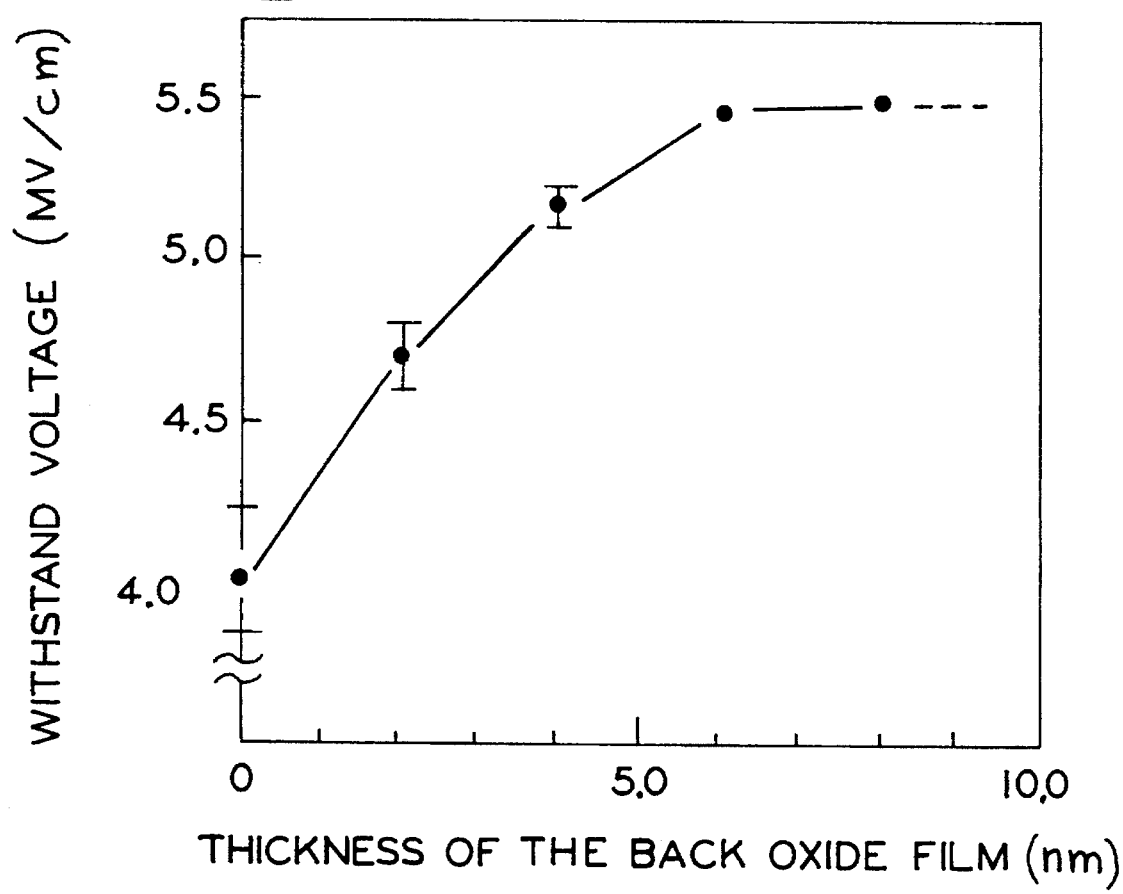

FIG_8A
FROM THE TRANSISTOR
OF THE FIRST PART
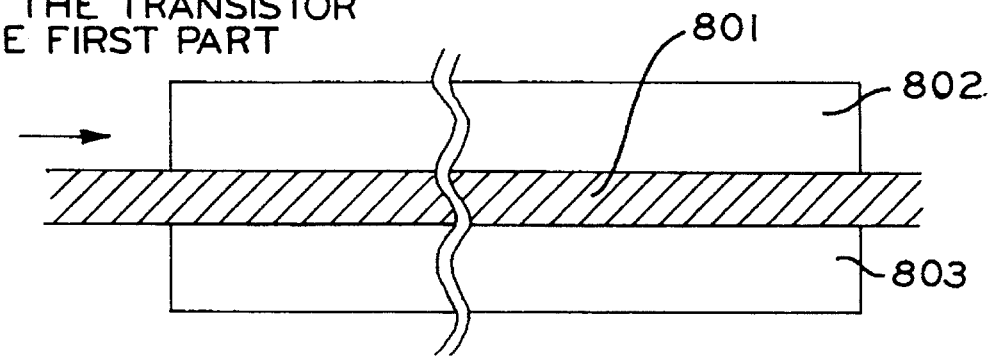
FIG_8B
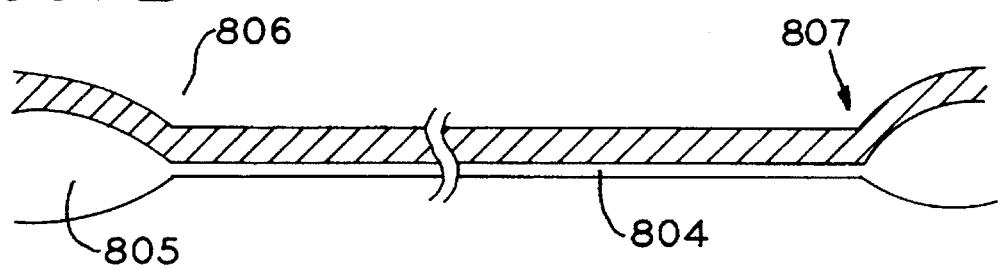
FIG_8C
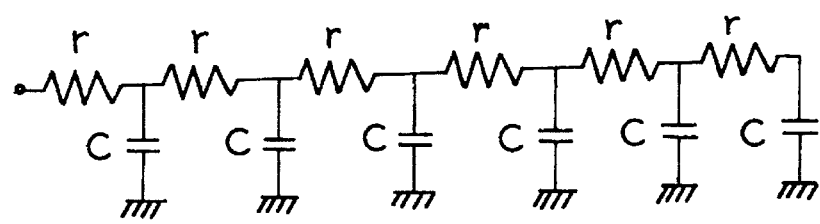

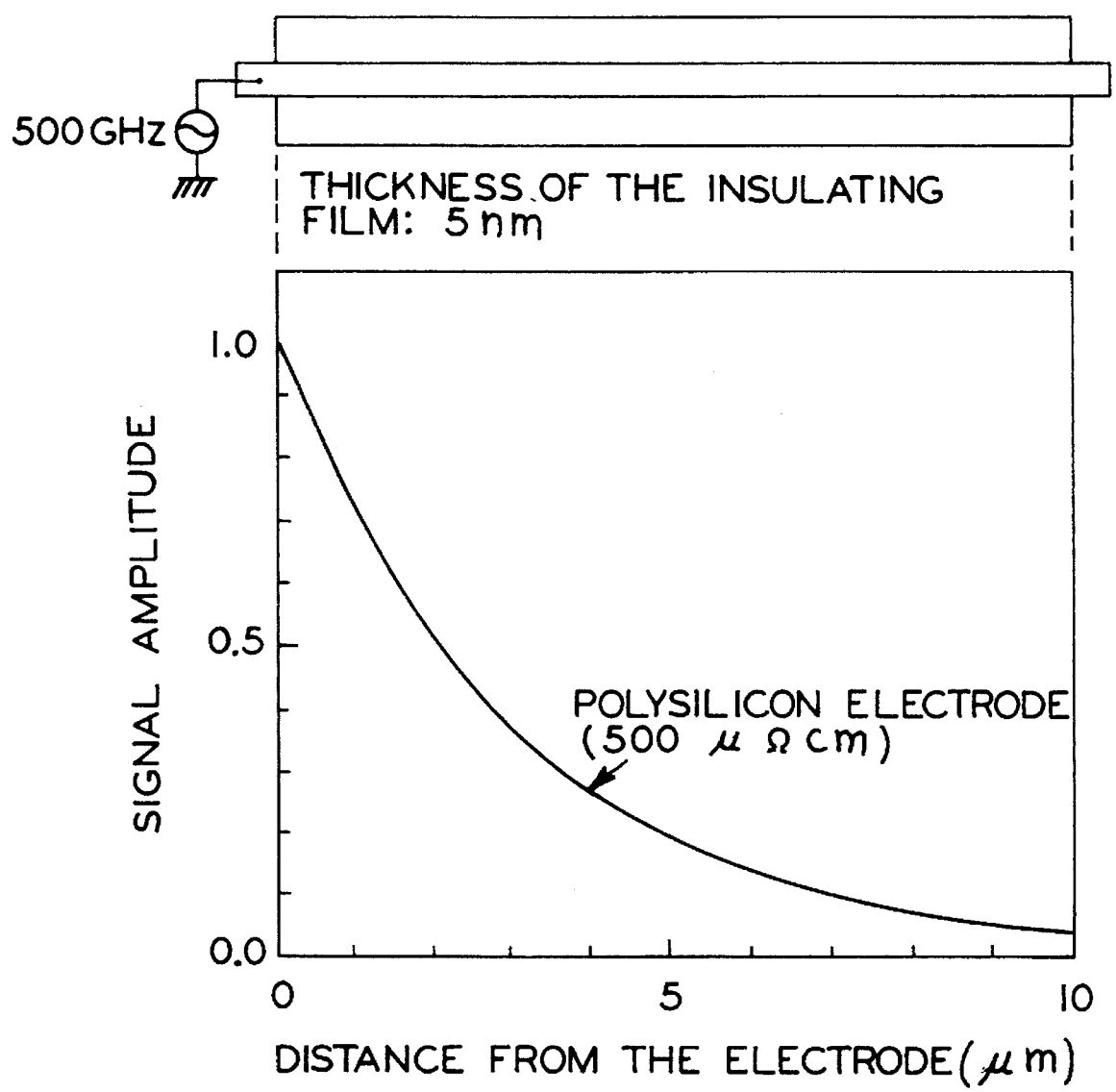

SEMICONDUCTOR DEVICE

TECHNICAL FIELD

This invention relates to a semiconductor device, and in particular relates to a semiconductor device capable of high speed operation.

BACKGROUND ART

At present, a technique for a semiconductor integrated circuit has been developed indeed at an amazingly-level of high speed. Such surprising grade, amount, and level of development is largely owing to fine-element promotion planning. The fine-element promotion enables integration of more elements within one chip, and as a result, more functions per chip can be realized. One more large effect by the fine-element promotion is to realize a high speed. A current and voltage formula in a saturated region of MOS-FET is expressed by the following equation (2).

$$I_D = (W/2L) \cdot \mu_c \cdot C_{ox}(V_G - V_{VH})^2 \qquad (2)$$

where, $$C_{ox} = (\epsilon_0 \cdot \epsilon_r)/d_{ox}$$

and

W: gate width
L: gate length
$\mu_c$: channel mobility
$C_{ox}$: gate oxide film capacitance per unit area
$V_G$: gate voltage
$V_{TH}$: threshold voltage
$\epsilon_0$: dielectric constant of vacuum
$\epsilon_r$: dielectric constant of gate insulating film
$d_{ox}$: film thickness of gate insulating film Assume that a dimension of the device is scaled down at a rate of $\alpha$ times ($\alpha<1$). Even when a gate width W and a gate length L are reduced at a rate of $\alpha$ times, a drivable drain current $I_D$ does not vary. However if a thickness $D_{ox}$ of a gate insulating film is reduced at a rate of $\alpha$ times, a capacitance Cox of the gate insulating film goes at a rate of $1/\alpha$ times, and a drivable drain current $I_D$ increases at a rate of $1/\alpha$. Further, a load capacitance (normally, a gate capacitance on next stage) driven by this transistor is expressed by $C_{ox} \cdot L \cdot W$, and lowered at a rate of $\alpha$. Therefore, the required time for charging and discharging the load capacitance is sharply reduced at a rate of $\alpha^2$ times. Thus, improvement of the current driving capability and reduction of the load capacitance in respect of elements following the fine promotion have achieved the high speed operation.

However, realization of the fine-promotion policy is slowing down recently, where plane dimensions of the gate length L and the like reach 0.5 to 0.2 μm that is a theoretical limit value of pattern forming by light. For the gate insulating film, silicon thermal oxide film SiO₂ is ordinarily used, but its film thickness comes as thin as approximately 5 nm. This designates approximation to the limit value of the fine promotion process. For the pattern dimension, a dimension therefor equal to or less than 0.1 μm is intended by the use of X ray or electron beam, this now is in gradually obtaining satisfactory result.

However for the gate insulating film, leaving the present situation as it is, when approximating as thin as an extent of 3 nm, a current flows by a direct tunneling phenomenon to lose function as an insulating film. This means that the thickness of the insulating film reaches the limit value where it is principally no longer thinned. Therefore, it is in extremely difficult situation to improve the current driving capability by thinning the gate insulating film.

On the other hand, for a requirement of further upgrade of function per one chip, a largeness of the chip is gradually larger in reverse around the fine promotion policy of the element. Followingly, a length of wiring for connecting each functional block is also lengthened. In view of the transistor for driving such wiring, the load to be driven comes larger in reverse to normally smaller with proceeding of the fine promotion planning. Accordingly, a strong demand is directed to the improvement of the current driving capability of the elements.

The transistor for driving such larger load requires an extremely higher current driving capability, thus following the equation (2), a channel width is also required as large as ranging from several 10 μm to several 100 μm. In particular, the transistor used in an output stage to an external circuit is to have an extremely larger channel width W.

FIGS. 8(a) to 8(c) are a schematic view showing the conventional transistor structure, (a) is a plan view, (b) a sectional view, and (c) an equivalent circuit.

In the drawings, numeral 801 depicts a gate electrode made of n⁺ polysilicon, 802 and 803 a source and a drain respectively, 804 a gate insulating film made of SiO₂, and 805 a field oxide film.

The transistor described above, whose gate electrode itself is a RC distribution constant circuit, takes a finite time for transferring signals from the one end 806 to the other end 807 of the gate, see FIG. 8(c). FIG. 9 designates a state that, when applying high-frequency signals from one end of the gate, an amplitude of voltage is attenuated depending on propagation of the signals on the gate electrode. With the gate electrode having a larger resistance, the high-frequency component is attenuated, and the gate, which is allowed to have the larger width by all means, comes entirely impossible to effectively use.

Hence, the gate electrode must have a lower resistance as much as possible. For example, it may preferably be made of metal such as Al, whose melting point is 660° C., and a thermal treatment therefor is required to perform at least at a temperature equal to or less than 450° C. However, with the conventional ion injection procedure used, when an ion injected layer has an anneal temperature of 450° C., a reverse direction leakage current of PN junction is equal to or more than $10^{-3}$ A/cm², which entirely has been out of use.

Essentially, in the conventional transistor, the thinnered gate insulating film (SiO₂) is unused by the direct tunneling current of the insulting film, and in addition, in the transistor having a larger gate width for driving a particular higher current, the finite time is needed for the transistor to turn ON one end to the other end thereof, which is thus extremely disadvantageous for realization of high speed operation for the circuit.

The present invention has been made for solving the problems. The invention is to provide a semiconductor device with a high driving capability of current and capable of realizing high speed operation of a circuit.

DISCLOSURE OF THE INVENTION

A semiconductor device according to the invention, in a semiconductor device comprising a first semiconductor region of a (−) conduction type on a substrate body, source and drain regions of a reverse conduction type provided in the region, a first insulating film on the substrate body disposed between the source and the drain regions, and a gate electrode made of a conducting body on the first insulating film, is characterized in that the first insulating film is made of an insulating body having a dielectric constant of 8 or more, a film thickness thereof $t_I$ satisfies the following equation (1), and the source and drain regions are formed in a self aligning manner $$t_1 < 3 \times (\epsilon_r / \epsilon_{SiO2}) \text{ (nm)} \quad (1)$$

where $\epsilon_r$: a relative dielectric constant of the first insulating film $\epsilon_{SiO2}$: a dielectric constant of a silicon oxide film.

Function

A semiconductor device according to the present invention provides a high current driving capability of current which has not been realized in the conventional semiconductor devices, thus a high speed for circuits is possible. A smaller size is enough to obtain the equivalent driving capability of current as the conventional devices, this enables a high integration.

BRIEF DESCRIPTION OF THE DRAWINGS

FIG. 3 is a graphical representation of a relationship between an anneal temperature and a leakage current in comparison of the prior art with the an ultra-cleaning ion injection technique of the present embodiment with less impurity mixtured.

FIG. 4 is an attenuation state of signal amplitudes in comparison between the conventional polysilicon electrode and an Al electrode in case where a high-frequency signal is input from one end of a gate electrode.

FIG. 5 is a graphical representation showing a relationship between a drain current and a drain voltage standardized by a gate length L and a gate width W with respect to a transistor according to the first embodiment.

FIG. 6 relates to a second embodiment, FIG. 6(a) is a sectional view of a semiconductor device, FIG. 6(b) is a graphical representation of difference of an interface state density due to presence of Si oxide film 203.

FIG. 7 relates to a third embodiment, FIG. 7(a) is a sectional view showing an end of a gate electrode of a semiconductor device, and FIG. 7(b) is a graphical representation showing a relationship between a back oxide film thickness formed by anode oxidation procedure and a gate insulating film withstand voltage.

FIG. 8 shows the conventional example, FIG. 8(a) a plan view, FIG. 8(b) a sectional view, and FIG. 8(c) an equivalent circuit.

FIG. 9 is a graphical representation in case of applying high-frequency signals from one end of a gate in respect of attenuation of voltage amplitudes of the signals depending on propagation of the signals on a gate electrode.

Figure 1:
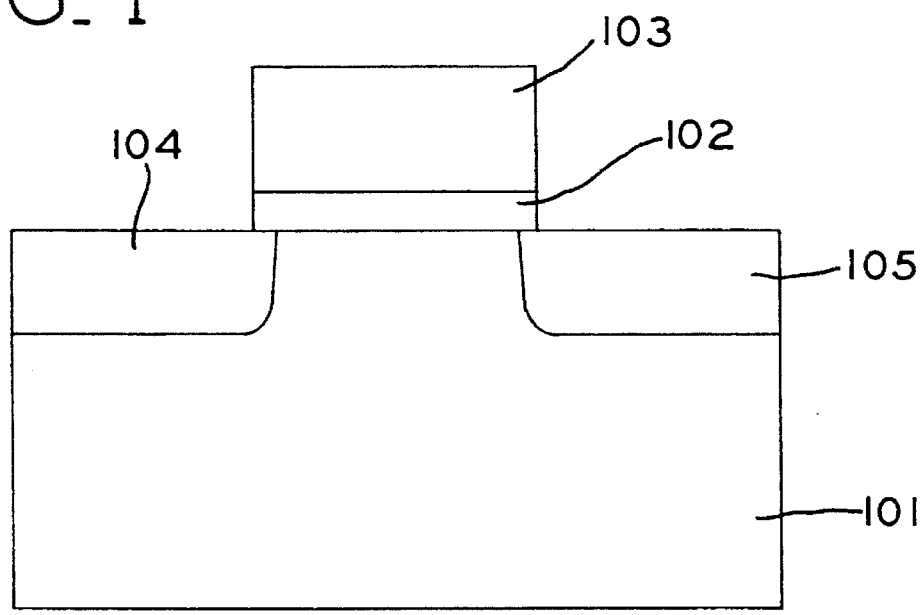
FIG. 1 is a sectional view of a semiconductor device showing a first embodiment according to the invention.

Reference Numeral 101 depicts a p-type silicon substrate (base body), 102 a gate insulating film made of $Al_2O_3$ (relative dielectric constant: 8.5), 103 an Al gate electrode, 104 a $n^+$ source, 105 a $n^+$ drain, 201 a P-type silicon substrate, 202 a first gate insulating film ($Ta_2O_5$), 203 a Si oxide film, 301 a drain, 302 an Al gate electrode, 303 $Ta_2O_3$, 304 a gate electrode end, 305 a flat portion, 801 a gate electrode made of $n^+$ polysilicon, 802 a source, 803 a drain, 804 a gate insulating film made of $SiO_2$, 805 a field oxide film, 806 one end of a gate, and 807 another end of the gate.

BEST MODE FOR CARRYING OUT THE INVENTION (First Embodiment)

FIG. 1 is a sectional view of a semiconductor device showing a first embodiment according to the present invention.

In the drawing, 101 depicts a p-type silicon substrate, 102 a gate insulating film with a thickness of 5 nm made of $Al_2O_3$ (relative dielectric constant: 8.5), 103 an Al gate electrode, and 104 and 105 a $n^+$ source and a $n^+$ drain respectively. The source and drain are formed in that, for example, after forming the Al electrode by RIE using $Cl_2$, a gate insulating film is removed, thus exposed Si surface is injected with As, for example, at an energy level of 25 KeV with a dose amount of $5 \times 10^{15}$ cm$^{-2}$. The ion injection is performed in a self aligning manner using the Al gate electrode as a mask.

Annealing for ion injection layer is performed at a lower temperature of 450° C. The gate insulating film is removed before ion injection for preventing knock-on to a Si substrate of oxygen atom included in the insulating film. When ion injecting without performing such removing, it has been found that the sufficiently long time is required for the annealing after ion injection.

For the ion injection equipment there has been used an ultra cleaning ion injection equipment which is allowed to have a high vacuum degree than $10^{-9}$ Torr and whose contamination due to sputtering of chamber metallic material by ion beam is satisfactorily lowered. This provides sufficiently lower impurity mixture such as oxygen O, carbon C and the other metallic elements to the ion injection layer and enables, for the first time, the production of a device by low temperature annealing at 450° C. The lower contamination level of metal provides the better result, and in our experimentation result, it is found that the contamination may preferably be suppressed to 0.1% or less for the dose amount of As.

Figure 2:
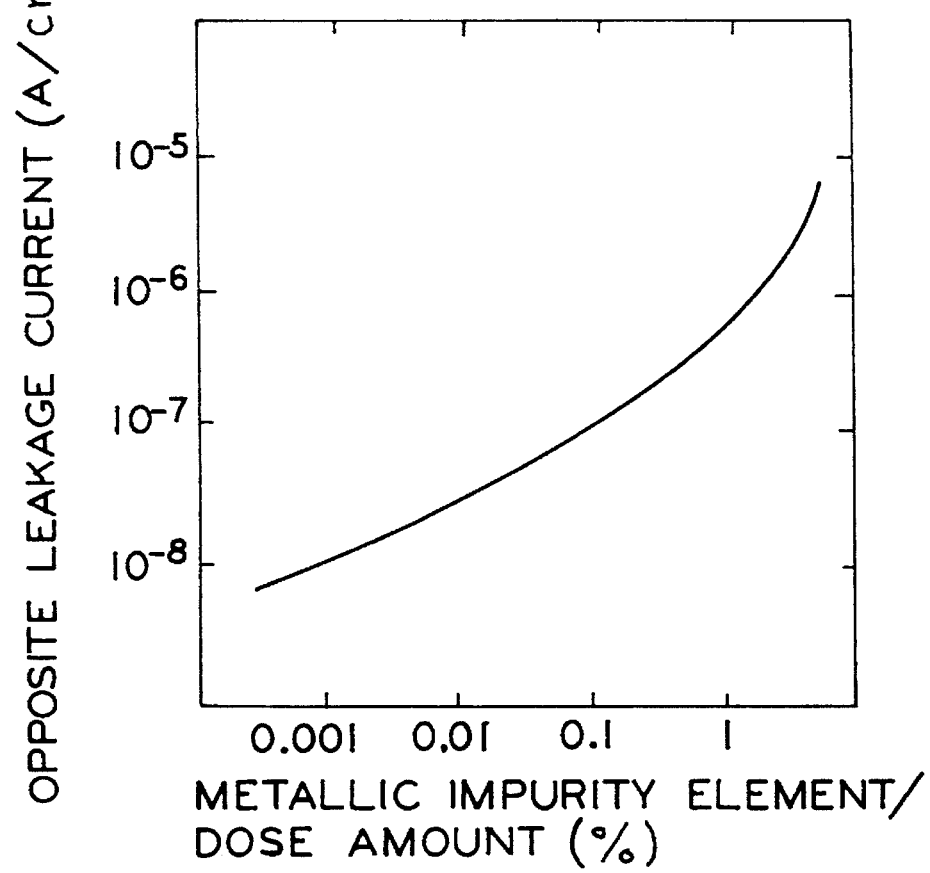
FIG. 2 is a graphical representation showing a relationship between a mixture amount (expressed by a ratio with a dose amount) of metallic impurity elements and a leakage current of a PN junction annealed at a temperature of 450° C.

FIG. 2 shows a relationship between a mixture amount (a ratio with the dose amount) of metallic impurity element and a leakage current of PN junction annealed at 450° C., and if the mixture amount is 0.1% or less of the dose amount, the leakage current is equal to an extent of $10^{-7}$ A/cm$^2$, preferably 0.001% or less. In such range, the PN junction having an extremely lower leakage of $10^{-8}$ A/cm$^2$ or less, is obtained.

FIG. 3 is a relationship between an annealing temperature and a leakage current in comparison of the prior art and an ultra cleaning ion injection technique where impurity mixture is reduced (the embodiment according to the present invention). The development of the ultra cleaning ion injection technique enables, the lower temperature annealing for the first time and the use of lower resistance material such as Al as a gate electrode.

FIG. 4 shows attenuation of signal amplitude in case of inputting high-frequency signals from one end of a gate electrode in comparison of the conventional polysilicon electrode and an Al electrode. The Al electrode provides smaller attenuation of the signal amplitude compared to the high resistance polysilicon electrode where the signal amplitude is considerably attenuated. Therefore, it is found that using the Al electrode, driving the entire gate width comes possible.

FIG. 5 is a relationship between a drain current and a drain voltage standardized by a gate length L and a gate width W with respect to a transistor experimentally produced in accordance with the present embodiment, where $Al_2O_3$ is used as a gate insulating film. For the same condition in way of applying voltage, the transistor of the embodiment is found capable of allowing two times the current to flow indeed, compared to that of the conventional example using $SiO_2$ as a gate insulating film. This designates that a dielectric constant 3.9 of Si oxide film for the gate insulating film corresponds to about two times of $Al_2O_3$ for this embodiment. As a consequence, about two times of dielectric constant value and about two times of the gate insulating film capacitance per unit area provide also two times of the channel carrier concentration which can be induced under the condition of using the same voltage. Thus, a current to be let flow is also two times the before. In case where the same current as in the transistor of this embodiment is intended to flow using the conventional Si oxide film ($SiO_2$), then this requires a film thickness of 2.5 nm or less for the oxide film ($SiO_2$). However as formerly described in the prior art problem, the Si oxide film with a film thickness of 3 nm or less is known to produce a leakage current called as a direct tunnel current. Thus in the conventional semiconductor device using Si oxide film, it is impossible to obtain the same current in the same largeness as in the semiconductor device of this embodiment at the same plane size. Conversely speaking, the foregoing means that there can be produced, in accordance with the present invention, a high current driving capability which is impossible to realize in the transistor using the conventional Si oxide film for the gate insulating film.

In such a manner, a larger capacitance of the gate insulating film per unit area enables larger driving capability of current of the transistor. Conventionally, the current driving capability has been improved by thinning the gate insulating film made of $SiO_2$. According to the present invention, the use of a larger dielectric constant for the insulating film increases the gate oxide film capacitance per unit area and also enlarges the current driving capability. The use of the insulating film with a larger dielectric constant is to equivalently thinner a film thickness of $SiO_2$. Thus in case of using a larger dielectric constant for the insulating film, an equivalent oxide film thickness ($SiO_2$ conversion) t' is defined as follows.

$$t' = t_f \times (\epsilon_{SiO2}/\epsilon_r) \text{ (nm)} \quad (3)$$

where $t_f$: film thickness of gate insulating film $\epsilon_r$: dielectric constant of gate insulating film $\epsilon_{SiO2}$: dielectric constant of silicon oxide film If t'<3 nm is established, then in the transistor using $SiO_2$, an unrealizable high current driving capability is provided. From this condition there can easily be introduced the equation (1) described above. If a film thickness of the gate insulating film satisfies the equation (1), then a high current driving capability unrealizable in the conventional semiconductor device can be produced.

When a dielectric constant of the gate insulating film is 8 or more, then a thickness of 6 nm or more for the gate insulating film is preferable to let flow the same current as in the conventional transistor which uses the Si oxide film with a thickness of 3 nm. A leakage current due to a direct tunneling decreases in manner of an exponential function for a film thickness, thus the gate insulating film equal to or more than 6 nm has a considerably large allowance for the leakage current by the direct tunneling. This therefore comes possible to improve a reliability of the transistor.

In this embodiment, a p-type silicon is used as a substrate 101. However, according to the invention, any other semiconductors may preferably be utilized, for example, preferably a n-type silicon. In this embodiment, $Al_2O_3$ with a thickness of 5 nm is used as a gate insulating film 102. However according to the invention, any of others having a dielectric constant equal to or more than 8 with a film thickness of $t_1$ satisfying the equation (1) may preferably be utilized, for example, preferably $Ta_2O_5$ having 10 nm. In the embodiment, Al is used for the gate electrode 103. However, of course according to the invention, all of electrical conducting bodies using Al as a gate electrode 103 may preferably be utilized.

(Second Embodiment)

FIG. 6 shows a second embodiment according to the present invention.

FIG. 6(a) is a sectional view of a semiconductor device according to the present embodiment. A Si oxide film 203 formed by oxidation of a substrate Si is inserted between a p-type silicon substrate 201 and a $Ta_2O_5$ film 202 as a first gate insulating film.

The Si oxide film 203 is formed in an oxygen atmosphere at a temperature of 300° C. Continuously, metal Ta is formed by bias sputtering, and continuously directly oxidized without breaking vacuum to produce $Ta_2O_5$. Such continuous and direct oxidation without breaking vacuum provides a method of forming a considerably high quality of $Ta_2O_5$. The other portions are the same as those in the first embodiment, therefore the explanation thereof is omitted throughout.

A boundary face between the Si substrate and the gate insulating body corresponds to a channel portion where current flows, thus a boundary face characteristic affects a device characteristic of the semiconductor device. For example, with an interface state density being large, a carrier within the channel receives scattering, a mobility thereof is reduced. The decrease of the mobility causes to lower the current driving capability. Therefore, the interface state density is required to be suppressed as low as possible.

FIG. 6(b) shows a difference of an interface state density depending on presence of the Si oxide film 203. In absence of the Si oxide film, an interface state density is larger, and in addition, with a larger dispersion. However, when the Si oxide film exists, an interface state density is smaller (~5× $10^{10}$ $cm^{-2}$), and in addition, with a smaller dispersion.

A thicker film thickness of the Si oxide film decreases a gate capacitance determined by a series connected combined-capacitance with $Ta_2O_5$, and also an effect of the gate insulating film of the high dielectric body comes smaller. Thus, a film thickness of the Si oxide film is required thinner than $Ta_2O_5$ as a first gate insulating film.

In this embodiment, the p-type silicon is used as a substrate 201. However according to the invention, any other semiconductors all may preferably be used, for example, preferably a n-type silicon. In the embodiment, $Ta_2O_5$ which is formed by means of direct oxidation is used as a first gate insulating film. But, according to the invention, Ta$_2$O$_5$ formed into film by bias sputtering may preferably be utilized, or ones formed by the other methods may also be preferable. In the invention, the others with a dielectric constant equal to or more than 8 may be preferable, for example, preferably TiO$_2$. In the embodiment, the Si oxide film formed at a temperature of 300° C. is used as a second oxide film. However, in the present invention, a forming temperature is not limited to such 300° C.

(Third Embodiment)

FIG. 7 is a third embodiment according to the present invention.

FIG. 7(a) is a sectional view of an end of a gate electrode. Reference numeral 301 depicts a drain, 302 an Al gate electrode, and 303 Ta$_2$O$_5$. After ion injection and annealing for the source and the drain, the Al gate electrode surface is back oxidized by anode oxidation, thereby a bite shape of Al oxide Al$_2$O$_3$ is produced in the gate electrode end 304. Accordingly, a thickness of such portion of the gate insulating film is thicker than a flat portion 305, and an electric field concentration on the portion can be relaxed.

FIG. 7(b) is a relationship between a thickness of a back oxide film formed by the anode oxidation and a gate insulating film withstand voltage. In case of a thickness of 0 for the back oxide film, i.e., without performing the back oxidation, a withstand voltage of the gate insulating film is approximately 4 MV / cm. But, with the back oxidation performed, and with a film thickness gradually increased, the withstand voltage is more improved. When the back oxidation film thickness comes about 5 nm and is substantially equal to the gate insulating film Ta$_2$O$_5$, then an improvement of the withstand voltage is saturated. Then withstand voltage, about 5.5 MV / cm may be called as an intrinsic withstand voltage of Ta$_2$O$_5$ used herewith. That is to say, it shows a complete prevention of an electric field concentration effect (end effect) in the gate electrode end.

In this embodiment, Al is used as a gate electrode. However, in the invention, any of other conducting bodies may be preferable. In the embodiment, Ta$_2$O$_5$ is used for the first gate insulating film 303. However according to the invention, it is of course that Al$_2$O$_3$ or the like is also available. In the embodiment, Al$_2$O$_3$ in which the Al gate electrode is anode oxidized is utilized. However, according to the present invention, any of insulating films or insulating film forming methods, which are capable of enlarging an insulating film thickness at the gate electrode end, all may preferably be used, for example, such construction may preferably be formed by oxidation of only a Si substrate of the exposed gate electrode end by means of thermal oxidation or anode oxidation or the like.

Industrial Applicability

The present invention is to provide a semiconductor device having a high current-driving capability and capable of realizing high speed operations of circuits.

I claim:

1. In a semiconductor device comprising a substrate body a first semiconductor region of (−) conductivity type on the substrate body, source and drain regions of an opposite conductivity type provided in the semiconductor region, said source and drain regions formed in a self-aligning manner and separated by a spacing region, an insulating film disposed on the spacing region and between the source and the drain regions, a gate electrode having a conducting body disposed on the insulating film;

the insulating film comprising an insulating body having a dielectric constant of at least 8 and a film thickness $t_I$ which satisfies the following equation:

$$t_I < 3 \times (\epsilon_r / \epsilon_{SiO2}) \text{ (nm)}$$

where $\epsilon_r$=the dielectric constant of the insulating film $\epsilon_{SiO2}$=the dielectric constant of silicon oxide film.

2. A semiconductor device in accordance with claim 1, wherein a second insulating film, thinner than the insulating film, and which is formed by oxidizing a substrate, is disposed between the substrate and the first insulating film.

3. A semiconductor device in accordance with claim 1, wherein the gate electrode is comprised of metal.

4. A semiconductor device in accordance with claim 1, wherein at least one of the insulating film and an insulating film formed by oxidizing the gate electrode, is thicker on an end of the gate electrode.

5. A semiconductor device in accordance with claim 2, wherein the gate electrode is comprised of metal.

6. A semiconductor device in accordance with claim 2, wherein at least one of the insulating film, the second insulating film, and an insulating film formed by oxidizing the gate electrode, is thicker on an end of the gate electrode.

7. A semiconductor device in accordance with claim 3, wherein at least one of the insulating film, and insulating film formed by oxidizing the gate electrode, is thicker on an end of the gate electrode.

\* \* \* \* \*

UNITED STATES PATENT AND TRADEMARK OFFICE
CERTIFICATE OF CORRECTION

PATENT NO. : 5,528,068
APPLICATION NO. : 08/335871
DATED : June 18, 1996
INVENTOR(S) : Tadahiro Ohmi It is certified that error appears in the above-identified patent and that said Letters Patent is hereby corrected as shown below:

Col. 2, line 65, delete "(-)".

Col. 8, line 10, delete "(-)" and substitute --a--.

Signed and Sealed this

Twenty-first Day of October, 2008

JON W. DUDAS
*Director of the United States Patent and Trademark Office*